United States Patent [19]

Germer

[11] Patent Number: 5,514,958

[45] Date of Patent: May 7, 1996

[54] ELECTRICAL ENERGY METERS HAVING FACTORY SET CALIBRATION CIRCUITS THEREIN AND METHODS OF CALIBRATING SAME

[75] Inventor: Warren R. Germer, Hampton, N.H.

[73] Assignee: General Electric Comapny, New York, N.Y.

[21] Appl. No.: 343,192

[22] Filed: Nov. 22, 1994

[51] Int. Cl.$^6$ ............................ G01R 11/32; G01R 35/04
[52] U.S. Cl. ................................................. 324/74; 324/142
[58] Field of Search ............................ 324/142, 74, 127, 324/130, 571.01, 571.06

[56] References Cited

U.S. PATENT DOCUMENTS

| 4,843,306 | 6/1989 | Meuller | 324/74 |
| 5,231,347 | 7/1993 | Voisine et al. | 324/142 |

OTHER PUBLICATIONS

GE Brochure GEH–5071, *Type TM–900E™ TOU Register, Type TMR–900E™ TOU Recording Register On Type EV/ES Meter Platform*, Oct. 1992.
GE Brochure GEA 12074, *TM–900i Register, and TMR–900i Recording Register*, Feb. 1992.
GE Brochure GEA–11904, *TMR–900*, Jan. 1990.
GE Brochure GEA–11675A, *GE TMR–92 Tou Electronic Demand Recording Register*, 1988.
GE Brochure GEA–11685A, *The DR–87 Electronic Demand Recorder/Your Solution to Remote Data Retrieval*, Jun. 1985.

*Primary Examiner*—Ernest F. Karlsen
*Assistant Examiner*—Russell M. Kobert
*Attorney, Agent, or Firm*—Bell Seltzer Park & Gibson

[57] ABSTRACT

An apparatus for measuring electrical energy includes an electrical energy meter having built-in gain and power factor calibration circuits. The calibration circuits can be factory set so that the meter accurately measures the actual energy consumed by an energy user during the lifetime of the meter and does not need to be field calibrated. The gain calibration circuit preferably includes a bank of parallel-connected resistors which are arranged as a resistance ladder. These resistors facilitate calibration of the full load gain of the meter because they are connected as the input resistor to the meter's full load gain amplifier. By disconnecting one or more of the resistors from the ladder, the full load gain of the meter can be adjusted so that approximately 100% full load registration is achieved. The power factor calibration circuit also includes two pairs of antiparalled-connected diodes. These diodes can also be disconnected from the meter during factory calibration so that a range of sixteen different possible phase delays between the sampling time of the line voltage and the line current can be achieved. In this manner, the non-unity power factor response of the meter can be calibrated.

11 Claims, 5 Drawing Sheets

ELECTRICAL ENERGY METERS HAVING FACTORY SET CALIBRATION CIRCUITS THEREIN AND METHODS OF CALIBRATING SAME

FIELD OF THE INVENTION

The present invention relates to electrical energy measurement, and more particularly to apparatus and methods for measuring electrical energy.

BACKGROUND OF THE INVENTION

In the distribution of electrical energy, electric utility companies have typically found it desirable to measure not only real load energy as watthours delivered to a user, but also, reactive load quadergy as varhours (or reactive volt-ampere hours), apparent power and power factor. By measuring both watthours and varhours, electric utilities can more accurately apportion the costs of supplying energy to customers having varying demands and loads. To facilitate this goal, electrical utilities have sought to replace conventional electromechanical meters with more accurate and reliable microprocessor-controlled solid state meters which can measure both real and reactive quantities.

One such meter is the General Electric Type EV/ES Electronic Demand Meter with a TM-900E™ Time-of-Use (TOU) Register. This meter, which is commercially available from General Electric Company of Somersworth, N.H., includes solid state metering and registering circuits therein and has proven to be an industry leader because of its reliability, measurement accuracy and cost. The measurement circuit of this meter contains a measurement integrated circuit (IC). A potentiometer and a binary-coded rotary switch are also provided for facilitating factory and field calibration of the measurement IC. As understood by those skilled in the art, the potentiometer adjusts the full load gain of the measurement IC and the binary-coded rotary switch adjusts the non-unity power factor response of the measurement IC. The potentiometer and rotary switch insure that both real load energy and reactive load quadergy are measured accurately. FIG. 1 illustrates a functional block diagram of this prior art meter having a "full load adjust" circuit which includes a potentiometer and a "power factor adjust" circuit which includes a rotary switch. This prior art meter is more fully described in an instruction manual No. GEH-5071 entitled, Type TM-900E™ TOU Register and Type TMR-900E™ TOU Recording Register On Type EV/ES Meter Platform, which is publicly available from the General Electric Company, Somersworth, N.H., the disclosure of which is hereby incorporated herein by reference.

Full load adjustment of this meter is typically accomplished by a pre-calibration step and a final calibration step. During the pre-calibration step, a fixed value resistor is soldered into the full load adjust circuit after its value is determined from the results of an accuracy test performed on the measurement circuit. Then, during subsequent calibration steps, the potentiometer is adjusted until the meter is calibrated to within a few hundredths of a percent of 100% registration. The non-unity power factor adjustment step, which is performed after the full load calibration step, includes the steps of turning a 16-position binary-coded switch (BITS 0–3) until the "lag" registration is within 0.1% of the full load registration. Both the full load and lag final calibration adjustment steps are performed by trial and error. Typically, a calibration reading is taken manually or by a computer and then a test operator turns the potentiometer or switch in the appropriate direction so that the next calibration reading is within final limits. If not, another calibration step is performed and then repeated, if necessary, until proper registration is achieved. Besides the obvious expenses associated with this form of manual calibration, the potentiometer is also susceptible to "creep", which means that the resistance of the potentiometer can shift to higher or lower values during installation and/or during the lifetime of the meter. In addition, both the potentiometer and binary-coded rotary switch are relatively expensive.

One attempt to prevent potentiometer "creep" is disclosed in U.S. Pat. No. 4,843,306 to Meuller. In particular, Meuller discloses a meter having a pair of calibration resistors which can be removed and replaced with other resistors during initial and field calibration. However, in order to calibrate the meter, repeated "trial and error" calibration steps may be necessary to achieve final calibration, which can be time consuming and expensive as explained above.

Thus, notwithstanding these prior art meters, there still exists a need for an electrical energy meter of low cost design which can be simply and accurately calibrated.

SUMMARY OF THE INVENTION

It is therefore an object of the present invention to provide an apparatus for accurately measuring electrical energy and other related quantities.

It is another object of the present invention to provide an apparatus for measuring electrical energy which can be calibrated prior to installation in the field, and method of calibrating same.

It is a further object of the present invention to provide an apparatus for measuring electrical energy which does not require the performance of repeated trial and error calibration steps to achieve final calibration.

These and other objects, features and advantages are provided, according to the present invention, by an electrical energy meter having built-in gain and power factor calibration circuits. The calibration circuits can be factory set so that the meter accurately measures the actual energy consumed by an energy user during the lifetime of the meter and does not need to be field calibrated. The gain calibration circuit preferably includes a bank of parallel-connected resistors which are arranged as a resistance ladder. The resistors of the ladder are preferably selected to be of different values in the range of about $1 \times 10^3$ to $1 \times 10^6$ Ohms. The resistors of the ladder can also be arranged in increasing order with each consecutively higher order resistor having a resistance two times the resistance of the adjacent lower order resistor. These resistors facilitate calibration of the full load gain of the meter because they are connected as the input resistor to the meter's full load gain amplifier. Accordingly, by disconnecting one or more of the resistors from the ladder, the full load gain of the meter can be adjusted so that approximately 100% full load registration is achieved. The power factor calibration circuit also includes two pairs of antiparallel-connected diodes. These diodes can also be disconnected from the meter during factory calibration so that a range of sixteen different possible phase delays between the sampling time of the line voltage and the line current can be achieved. In this manner, the non-unity power factor response of the meter can be calibrated.

DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
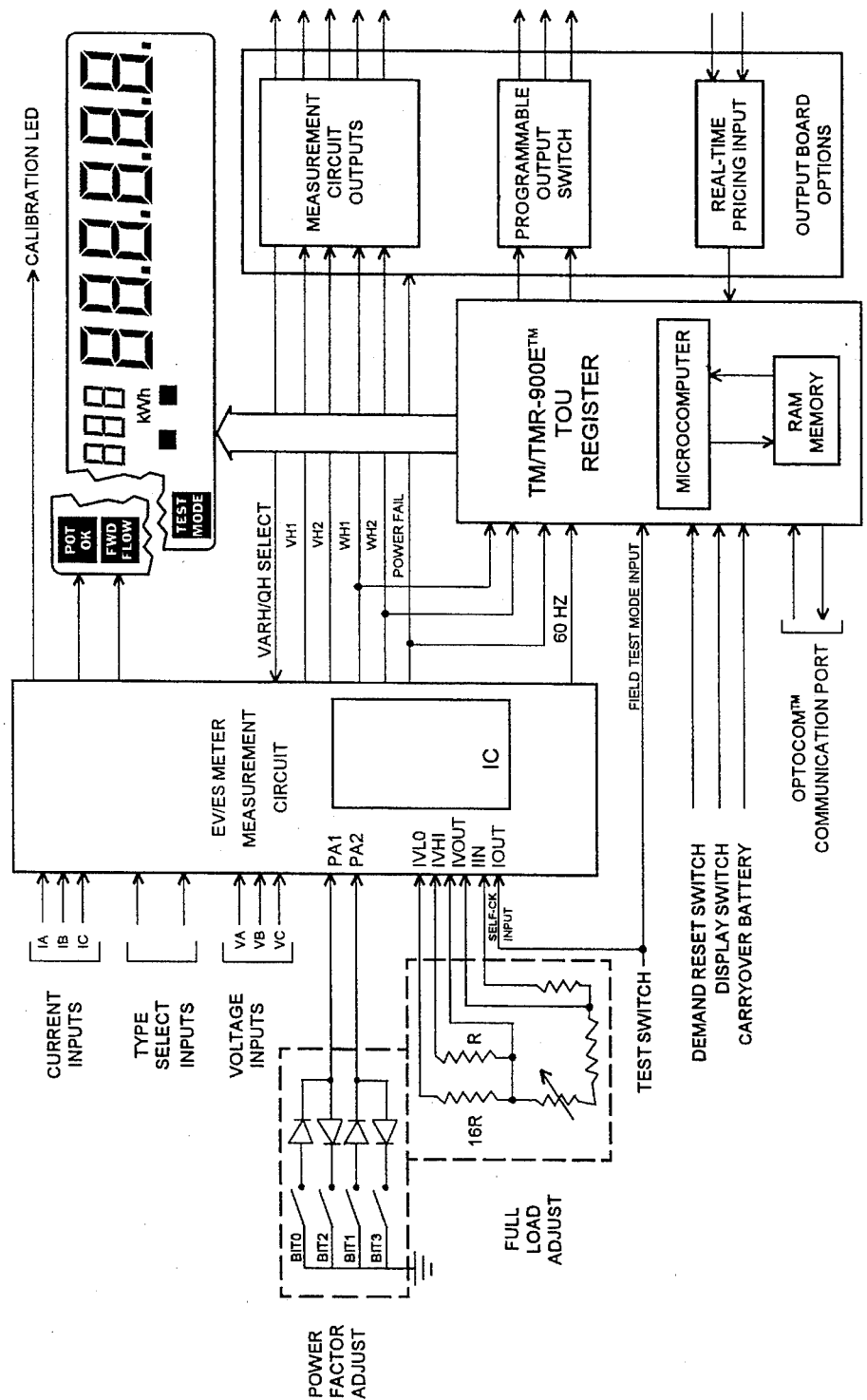
FIG. 1 is a block diagram of a prior art electrical energy meter.
Figure 2:
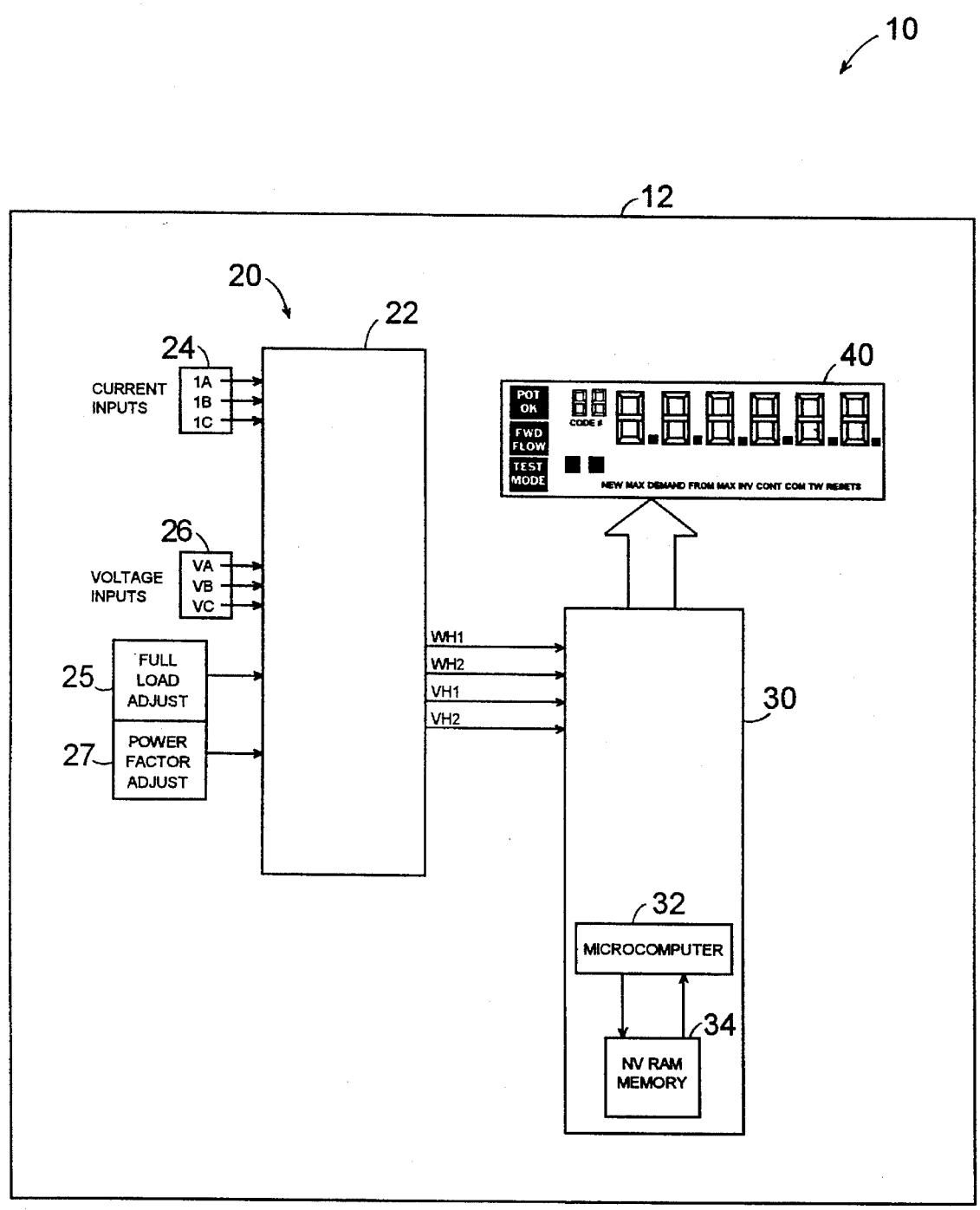
FIG. 2 is a block diagram of an electrical energy meter according to an embodiment of the present invention.
Figure 3:
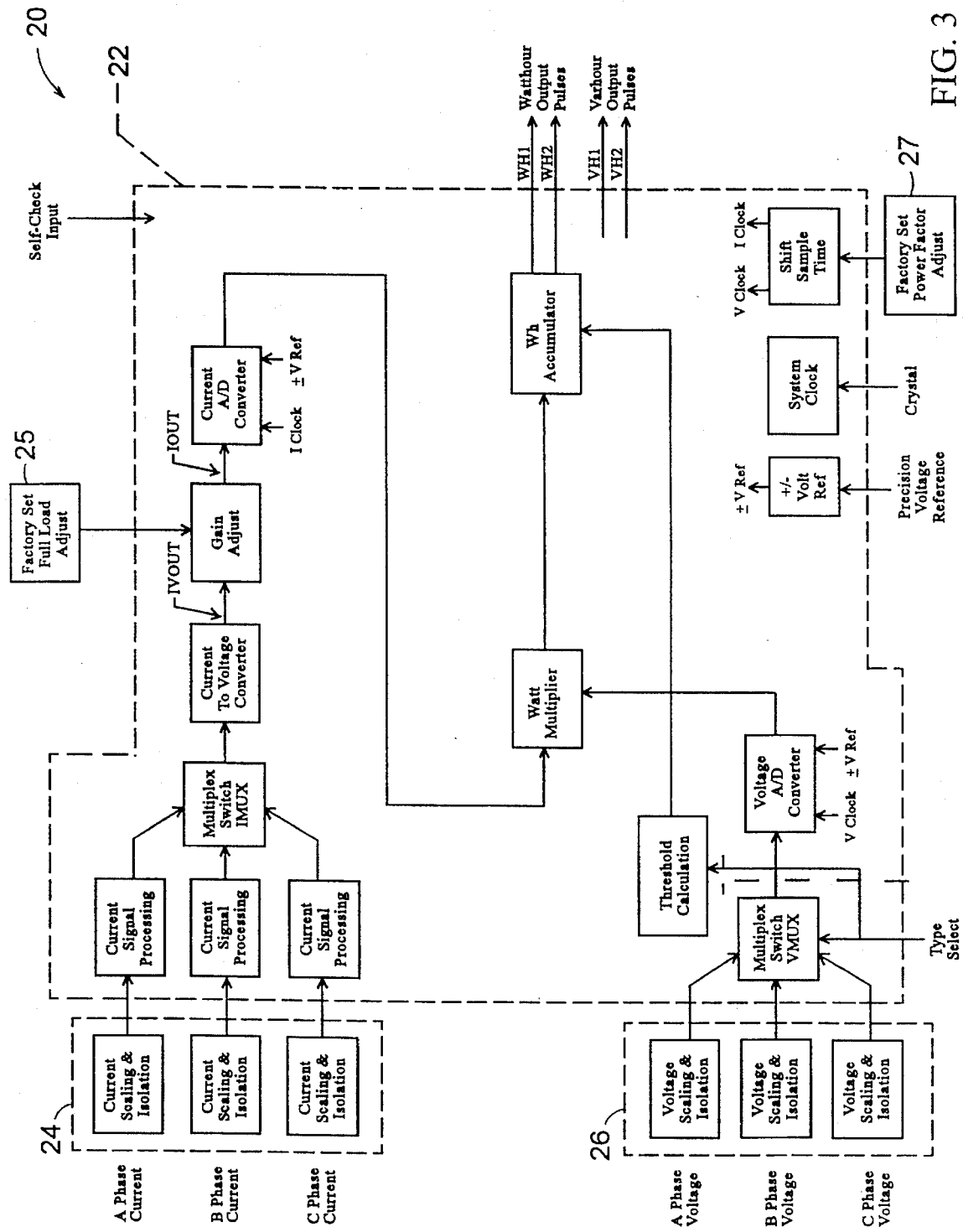
FIG. 3 is a functional block diagram of a metering circuit according to the present invention.
Figure 4:
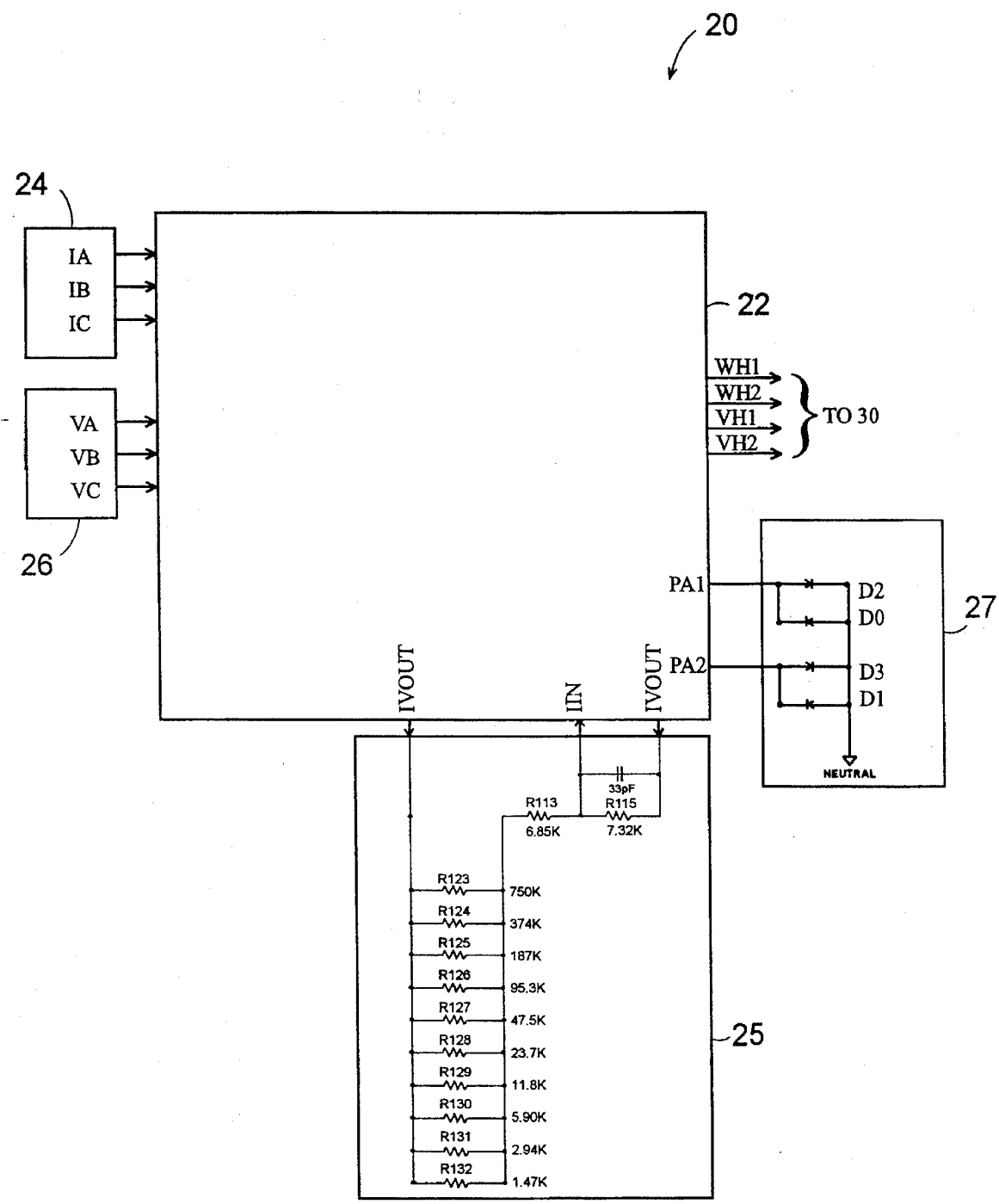
FIG. 4 is a schematic diagram of the metering circuit of FIG. 3.

Referring now to FIGS. 2–4, a three-phase electrical energy meter 10 according to a preferred embodiment of the present invention is illustrated. The meter 10 includes, among other things, a meter housing 12 and means 20, in the housing 12, for metering a quantity of electrical energy transferred from a power line to an electrical energy load during an energy measurement time interval. Metering means 20 includes means 24, 26 for sensing the line current and the line voltage transferred to the load, respectively. Sensing means 24, 26 may be of conventional design, but are preferably of the type disclosed in commonly assigned U.S. Pat. No. 5,066,904 to Bullock entitled "Coaxial Current Sensors", the disclosure of which is hereby incorporated herein by reference.

Metering means 20 further includes means 22 for generating energy signals (e.g., WH1, WH2, VH1, VH2) based on the sensed line voltage and the sensed line current. As will be understood by those skilled in the art, the energy signals may be watthour and varhour pulse train signals, as disclosed in U.S. Pat. No. 5,336,991 to Atherton et al. entitled Apparatus and Method For Measuring Electrical Energy And Quadergy and for Performing Line Frequency Compensation, the disclosure of which is hereby incorporated herein by reference. Generating means 22 is preferably an integrated circuit of the type described in commonly assigned U.S. Pat. Nos. 5,059,896 to Germer et al. entitled Electronic Watthour Meter; 5,245,275 to Germer et al. entitled Electronic Watthour Meter; 5,258,704 to Germer et al. entitled Electronic Watthour Meter; 5,315,235 to Atherton et al. entitled Electrical Energy Meter with Programmable Register Component; and 5,325,051 to Germer et al. entitled Electronic Watthour Meter, the disclosures of which are hereby incorporated herein by reference.

Means is also provided for calibrating the generating means 22 so that the energy signals accurately reflect the actual quantity of electrical energy that is transferred to the load. Calibrating means preferably comprises a gain calibration circuit 25 (entitled "full load adjust") and a power factor calibration circuit 27 entitled "power factor adjust"). In particular, the gain calibration circuit 25 is responsible for controlling the gain of an inverting operational amplifier which is illustrated by the block entitled "gain adjust" in FIG. 3. As illustrated, the "gain adjust" block has input and output terminals IVOUT and IOUT, respectively. As will be understood by those skilled in the art, the gain of an inverting operational amplifier having a grounded positive terminal equals $(-R_{fb}/R_{in})$, where $R_{in}$ is the input resistance between the input terminal and the negative terminal of the amplifier and $R_{fb}$ is the feedback resistance between the negative terminal and the output terminal of the amplifier. As defined herein, the negative and output terminals of the amplifier are IIN and IOUT, respectively, which have potentials $V_{IIN}$ and $V_{IOUT}$. Accordingly, the potential at the output terminal of the "gain adjust" block of FIG. 3 (i.e., $V_{IOUT}$) equals the potential at the input terminal ($V_{IVOUT}$) times the gain $(-R_{fb}/R_{in})$.

Referring now to FIG. 4, the gain calibration circuit 25 according to the present invention includes a plurality of parallel-connected resistors (R132–R123), which are arranged as a resistor ladder. As illustrated, the resistance ladder and R113 (6.65K Ohms) are electrically connected in series between the input terminal IVOUT of the "gain adjust" block and the negative terminal IIN of the amplifier. The resistance ladder and R113 therefore comprise $R_{in}$ of the inverting amplifier. Resistor R115 (7.32K Ohms) is also electrically connected as the feedback resistor $R_{fb}$, between terminals IIN and IOUT. The plurality of parallel-connected resistors preferably include ten (10) resistors which range in value from 1.47K Ohms to 750K Ohms. The resistors are also preferably arranged in increasing order from a first resistor (R132) having the lowest resistance (1.47K Ohms) to a last resistor (R123) having the highest resistance (750K Ohms). Each resistor in the ladder also has a resistance approximately two times (2×) greater than the adjacent lower order resistor. The use of ten (10) resistors provides the capability of making relatively large adjustments in the full load gain of the meter at unity power factor. These adjustments are obtained by disconnecting one or more resistors from the ladder, so that the gain of the amplifier is changed. The resistor ladder can also compensate for relatively large ranges in tolerances of the meter components such as line current sensing means 24. In particular, the use of ten (10) resistors in the ladder provides up to 1023 or $2^{10}-1$ possible resistance combinations. In particular, the meter 10 is manufactured so that the gain of the amplifier has a default value of 0.9910 with all the resistors present in the ladder, and a range in gains from 0.9910 to 0.0097 if all resistors but R123 (750K Ohms) have been removed from the ladder. The 2×weighting of the resistance values is also preferably chosen to provide a high degree of incremental resolution in the full load gain, although other weighting values may be used. The range in gain of the amplifier is illustrated below in Table 1, where the notation "X" indicates that the respective resistor has been cut from the resistor ladder.

TABLE 1

| N | GAIN | R123 | R124 | R125 | R126 | R127 | R128 | R129 | R130 | R131 | R132 |
|---|------|------|------|------|------|------|------|------|------|------|------|
| 0 | 0.9910 | | | | | | | | | | |

TABLE 1-continued

| N | GAIN | R123 | R124 | R125 | R126 | R127 | R128 | R129 | R130 | R131 | R132 |
|---|------|------|------|------|------|------|------|------|------|------|------|
| 1 | 0.9909 | | | | | | | | | | X |
| 2 | 0.9908 | | | | | | | | | X | |
| 3 | 0.9907 | | | | | | | | | X | X |
| 4 | 0.9906 | | | | | | | | X | | |
| 5 | 0.9905 | | | | | | | | X | | X |
| 6 | 0.9904 | | | | | | | | X | X | |
| 7 | 0.9903 | | | | | | | | X | X | X |
| 8 | 0.9902 | | | | | | | X | | | |
| 9 | 0.9901 | | | | | | | X | | | X |
| | | | | | | | ● | | | | |
| | | | | | | | ● | | | | |
| | | | | | | | ● | | | | |
| | | | | | | | ● | | | | |
| N | 0.0097 | | X | X | X | X | X | X | X | X | X |

The power factor calibration circuit 27 is also provided so that the non-unity power factor response of the generating means 22 can be controlled. This is done by shifting the clocks (V CLOCK, I CLOCK) which are used to sample the sensed line voltage and line current signals, if necessary, so that the energy signals (WH1, WH2, VH1, VH2) reflect the actual quantity of electrical energy transferred to a load, even if the load has a non-unity power factor. For example, such loads would include highly inductive loads with a lagging power factor. As will be understood by those skilled in the art, the phase delay for sampling the sensed line current relative to the sensed line voltage can be adjusted using the hex-coded rotary switch of the prior art. As illustrated by FIG. 4, however, a power factor calibration circuit 27 having two pairs of antiparallel-connected diodes preferably replaces the rotary switch. In particular, the meter 10 is preferably manufactured with all four discrete diodes (D0–D3) present (Logic as illustrated. However, during factory calibration, one or more of the diodes may be disconnected from the circuit 27 (Logic 0) so that proper phase delay is achieved. As illustrated below in Table 2, the phase delay (PD) of ICLOCK relative to VCLOCK can be adjusted in the range from −0.208 to 0.573 degrees.

TABLE 2

| D3 | D2 | D1 | D0 | HEX CODE | PHASE DELAY FOR CURRENT SAMPLE (DEGREES) |
|----|----|----|----|----------|------------------------------------------|
| 0 | 1 | 0 | 1 | 5 | 0.573 |
| 0 | 1 | 1 | 0 | 6 | 0.521 |
| 0 | 1 | 1 | 1 | 7 | 0.469 |
| 1 | 0 | 0 | 0 | 8 | 0.417 |
| 1 | 0 | 0 | 1 | 9 | 0.364 |
| 1 | 0 | 1 | 0 | A | 0.312 |
| 1 | 0 | 1 | 1 | B | 0.260 |
| 1 | 1 | 0 | 0 | C | 0.208 |
| 1 | 1 | 0 | 1 | D | 0.156 |
| 1 | 1 | 1 | 0 | E | 0.104 |
| 1 | 1 | 1 | 1 | F | 0.052 |
| 0 | 0 | 0 | 0 | 0 | 0 |
| 0 | 0 | 0 | 1 | 1 | −0.052 |
| 0 | 0 | 1 | 0 | 2 | −0.104 |
| 0 | 0 | 1 | 1 | 3 | −0.156 |
| 0 | 1 | 0 | 0 | 4 | −0.208 |

Figure 5:
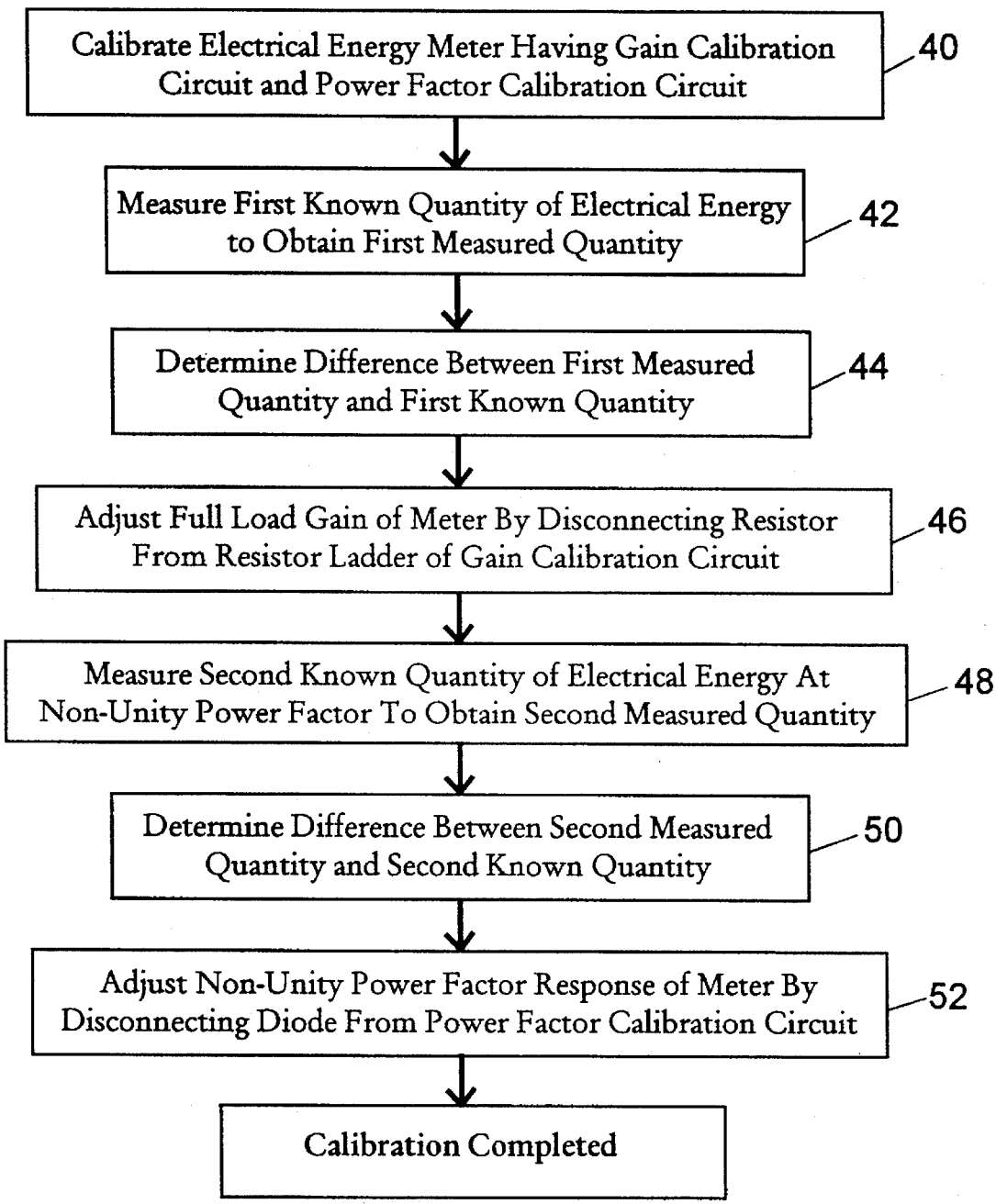
FIG. 5 is a flow diagram illustrating steps for calibrating an electrical energy meter according to the present invention.

Referring now to FIG. 5, a preferred method 40 of calibrating the electrical energy meter 10, according to the present invention, will be described. The method 40 begins with the step of connecting the meter 10 to a test load and then measuring a first known quantity of unity power factor energy to obtain a first measured quantity, Block 42. Because the meter 10 is manufactured with all of the resistors (R123–R132) of the resistor ladder present, the first measured quantity will be a function of, among other things, the default resistance of the resistor ladder. This default resistance corresponds to the default gain of the amplifier which equals 0.9910. The difference between the first known quantity and the first measured quantity is then determined to see if the full load gain needs to be adjusted, Block 44. The first measured quantity will in all likelihood be different from the first known quantity because the first resistance (i.e., default value of $R_{in}$ with all the resistors in the ladder present) assumes worst case design criteria for the components of the meter 10. Based on the first measured quantity, a second resistance value for $R_{in}$ is determined so that a subsequent measurement of the first known quantity of energy, if performed, would result in a first measured quantity that equals the first known quantity. This step is preferably performed with the assistance of a computer. Based on the second resistance, the full load gain of the meter 10 is adjusted by disconnecting at least one resistor from the resistor ladder so that the resistance $R_{in}$ equals the second resistance, Block 46. This step can also be performed using a computer and automated control tool such as a robot.

Following these steps, a second known quantity of electrical energy is measured by the meter 10 at non-unity power factor (e.g., 60° lagging power factor) to obtain a second measured quantity, Block 48. The difference between the second measured quantity and the second known quantity is then determined, Block 50. This non-unity power factor measurement is performed with all the diodes (D0-D3) present. Thus, as illustrated by Table 2, the default shift in sampling time of the current relative to the voltage is 0.052 degrees. However, if the second measured quantity is different than the second known quantity, a determination is made as to which of the diodes should be disconnected to achieve the proper delay in sampling time of the current relative to the voltage. This step is preferably performed with the assistance of a computer. Based on this determination, at least one of the diodes is disconnected so that a subsequent measurement of the second known quantity of energy, if performed, would result in a second measured quantity that equals the second known quantity, Block 52. Once this step is performed, calibration is complete and the meter 10 is ready to be shipped.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An electrical energy meter, comprising:

a meter housing;

means, in said housing, for metering a quantity of electrical energy transferred from a line to a load during an energy measurement time interval, said metering means comprising:

means for sensing a line voltage and a line current transferred to the load during the energy measurement time interval;

means, connected to said sensing means, for generating an energy signal based on the sensed line voltage and the sensed line current; and means, connected to said generating means, for calibrating said generating means so that the energy signal accurately reflects the quantity of electrical energy transferred to the load during the energy measurement time interval, said calibrating means comprising a power factor calibration circuit containing at least one pair of antiparallel-connected diodes and a gain calibration circuit having a plurality of parallel connected resistors therein, and wherein all but one of said plurality of resistors have a resistance greater than the resistance of another of said plurality of resistors; and means, in said housing and responsive to said metering means, for registering the metered quantity of electrical energy transferred to the load during the energy measurement time interval.

2. The meter of claim 1, further comprising a printed circuit board in said housing, and wherein said plurality of resistors are fixedly attached to said printed circuit board and are arranged as a resistor ladder.

3. The meter of claim 2, wherein the resistor ladder contains ten resistors having a resistance in the range from between about $1 \times 10^3$ to $1 \times 10^6$ Ohms.

4. The meter of claim 3, wherein said plurality of resistors of the resistor ladder are arranged in monotonically increasing order from a first resistor having a lowest resistance to a last resistor having a highest resistance.

5. The meter of claim 1, wherein all but one of said plurality of resistors have a resistance about two times greater than the resistance of another of said plurality of resistors.

6. The meter of claim 1, further comprising:

means, electrically connected to said registering means, for displaying the quantity of electrical energy transferred to the load during the energy measurement time interval.

7. The meter of claim 6, wherein said metering means comprises a first solid-state integrated circuit and wherein said registering means comprises a second solid-state integrated circuit.

8. The meter of claim 7, wherein said displaying means comprises a liquid crystal display.

9. An electrical energy meter, comprising:

a meter housing;

a printed circuit board in said housing;

means, on said printed circuit board, for metering a quantity of electrical energy transferred from a line to a load during an energy measurement time interval, said metering means comprising:

means for sensing a line voltage and a line current transferred to the load during the energy measurement time interval;

means, connected to said sensing means, for generating an energy signal based on the sensed line voltage and the sensed line current; and means, connected to said generating means, for calibrating said generating means so that the energy signal accurately reflects the quantity of electrical energy transferred to the load during the energy measurement time interval, said calibrating means comprising a power factor calibration circuit containing at least one pair of antiparallel-connected diodes and a gain calibration circuit having a resistor ladder therein containing at least three resistors of different resistance, and wherein each resistor is fixedly attached to said printed circuit board and includes a resistive portion and exposed dual lead portions which can be cut so that respective resistive portions can be readily disconnected from the resistor ladder to facilitate calibration of said generating means;

means, on said printed circuit board and responsive to said metering means, for registering the metered quantity of electrical energy transferred to the load during the energy measurement time interval; and means, electrically connected to said registering means, for displaying the quantity of electrical energy transferred to the load during the energy measurement time interval.

10. The meter of claim 9, wherein the resistors of said resistor ladder are arranged in increasing order from a first resister having a lowest resistance to a last resistor having a highest resistance.

11. A method of calibrating an electrical energy meter of the type containing a meter integrated circuit for metering a quantity of electrical energy transferred from a line to a load during an energy measurement time interval, first and second pairs of antiparallel-connected diodes for adjusting the non-unity power factor response of the meter integrated circuit, a resistor ladder for adjusting the full load gain of the meter integrated circuit, and a register integrated circuit for registering the metered quantity of electrical energy, said meter calibrating method comprising the steps of:

measuring a first known quantity of electrical energy to thereby obtain a first measured quantity of electrical energy which depends on a first resistance of the resistor ladder;

determining a difference between the first measured quantity and the first known quantity;

determining a second resistance of the resistor ladder such that the first measured quantity will equal the first known quantity;

disconnecting at least one resistor from the resistor ladder to obtain the second resistance;

measuring a second known quantity of electrical energy at non-unity power factor to thereby obtain a second measured quantity of electrical energy;

determining a difference between the second measured quantity and the second known quantity; and disconnecting at least one of the first and second pairs of antiparallel-connected diodes so that the second measured quantity will equal the second known quantity.

* * * * *